(12) United States Patent
Roberts et al.

(10) Patent No.: US 6,204,143 B1
(45) Date of Patent: Mar. 20, 2001

(54) METHOD OF FORMING HIGH ASPECT RATIO STRUCTURES FOR SEMICONDUCTOR DEVICES

(75) Inventors: Ceredig Roberts; Scott DeBoer, both of Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/293,635

(22) Filed: Apr. 15, 1999

(51) Int. Cl.$^7$ .................................................. H01L 21/20
(52) U.S. Cl. .......................... 438/396; 438/399; 438/637
(58) Field of Search .................................. 438/256, 399, 438/675, 637, 634, 622, 623, 672, 624, 396, 255, 253, 397

(56) References Cited

U.S. PATENT DOCUMENTS

| | | | |
|---|---|---|---|
| 5,821,164 | * | 10/1998 | Kim et al. . |
| 5,930,672 | * | 7/1999 | Yamamoto . |
| 6,033,977 | * | 3/2000 | Gutsche et al. . |
| 6,074,912 | * | 6/2000 | Liu et al. . |
| 6,080,653 | * | 6/2000 | Givens . |

\* cited by examiner

Primary Examiner—Tuan H. Nguyen

(57) ABSTRACT

Exemplary embodiments of the present invention disclose process steps to form high aspect ratio structures, such as a capacitor during semiconductor fabrication by the steps of: forming a first layer of planarized boro-phospho-silicate glass (BPSG) material over a conductive region; forming a first opening in said first layer of planarized BPSG material, said first opening aligning to said conductive region; forming a planarized polysilicon material into said first opening; forming a second layer of planarized BPSG material directly on said first layer of planarized BPSG material and said planarized polysilicon material; forming a second opening in said second layer of planarized BPSG material to expose a major portion of said planarized polysilicon material; removing said planarized polysilicon material to expose said underlying conductive region, said step of removing said planarized polysilicon comprises an etch possessing an etching selectivity ratio of polysilicon material to BPSG material that is greater than 10:1; forming a conformal conductive silicon layer into said first and second openings that makes contact with said conductive region; patterning said conformal conductive silicon layer into a first capacitor plate; forming a capacitor dielectric over said first capacitor plate, said first capacitor plate having an aspect ratio with the length being greater than the width; forming a second capacitor plate over said capacitor dielectric.

14 Claims, 5 Drawing Sheets

METHOD OF FORMING HIGH ASPECT RATIO STRUCTURES FOR SEMICONDUCTOR DEVICES

FIELD OF THE INVENTION

This invention relates to semiconductor fabrication processing and, more particularly, to a method for forming high aspect ratio structures, such as contact interconnects and capacitors for semiconductor devices.

BACKGROUND OF THE INVENTION

The continuing trend of scaling down integrated circuits has forced the semiconductor industry to consider new techniques for fabricating precise components at sub-micron levels. Along with the need for smaller components, there has been a growing demand for devices requiring less power consumption. In the manufacture of memory devices, these trends have led the industry to refine approaches to achieve thinner capacitor cell dielectric and surface enhanced storage capacitor electrodes.

As is the case for most semiconductor integrated circuitry, circuit density is continuing to increase at a fairly constant rate. In semiconductor devices it may be advantageous to build contact plugs for interlayer connections with high aspect ratio structures as circuit density will be enhanced. Also, in dynamic random access memory (DRAM) devices it is essential that storage node capacitor cell plates be large enough to exhibit sufficient capacitance in order to retain an adequate charge in spite of parasitic capacitance and noise that may be present during circuit operation. The issue of maintaining storage node capacitance is particularly important as the density of DRAM arrays continues to increase for future generations of memory devices. The ability to densely pack storage cells while maintaining required capacitance levels is a crucial requirement of semiconductor manufacturing technologies if future generations of expanded memory array devices are to be successfully manufactured.

The present invention develops a method to form high aspect ratio structures, such as interconnecting contact plugs and storage capacitors. Greater circuit density will be possible as the fabricated device will benefit from deep contact plug interconnects and/or increased storage electrode surface areas than are attainable in conventional processing methods.

SUMMARY OF THE INVENTION

The present invention teaches a method to form a high aspect ratio structure for a semiconductor device, such as an interconnect or a storage capacitor plate for memory devices. The interconnect structure is conductive is formed by using multiple building levels that successfully produce a structure that has an aspect ratio such that the length is greater than the width and the opposing walls are substantially parallel (i.e., the opposing walls of the structure intersects an underlying surface at an angle that is 88° or greater).

Each building level comprises the steps of 1) forming a planarized layer of insulation material, 2) forming an opening therein that is aligned to the underlying sacrificial material and then 3) forming a planarized sacrificial material into the opening. These steps may be repeated or even deleted as desired in order to obtain as deep (or as tall) of a structure as needed for a given device.

DETAILED DESCRIPTION OF THE INVENTION

Figure 1:
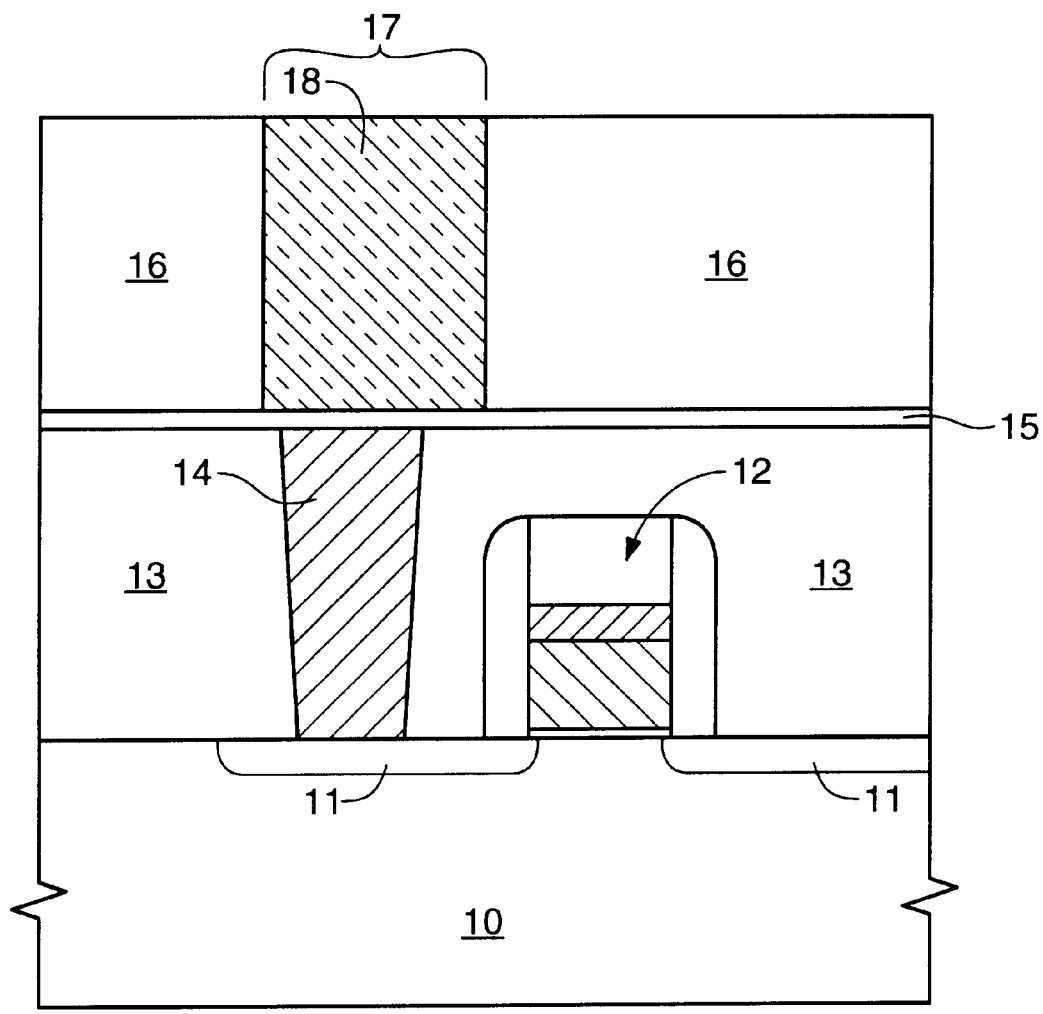
FIG. 1 is a cross-sectional view depicting a semiconductor substrate comprising an access transistor that has been prepared for processing in accordance with the present invention.
Figure 2:
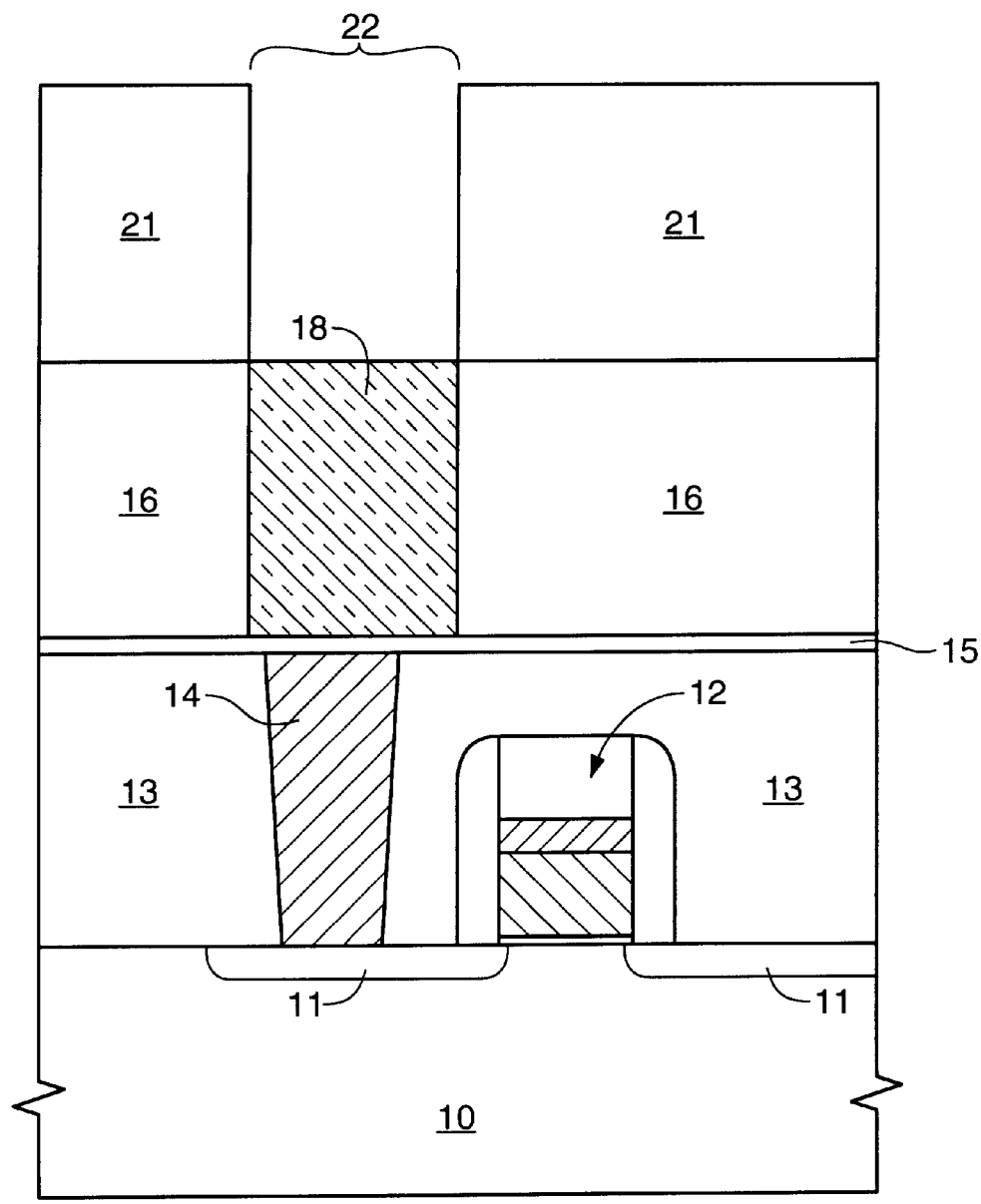
FIG. 2 is a subsequent cross-sectional view taken from FIG. 1 depicting the formation of several openings in multiple layers of planarized insulation material.
Figure 3:
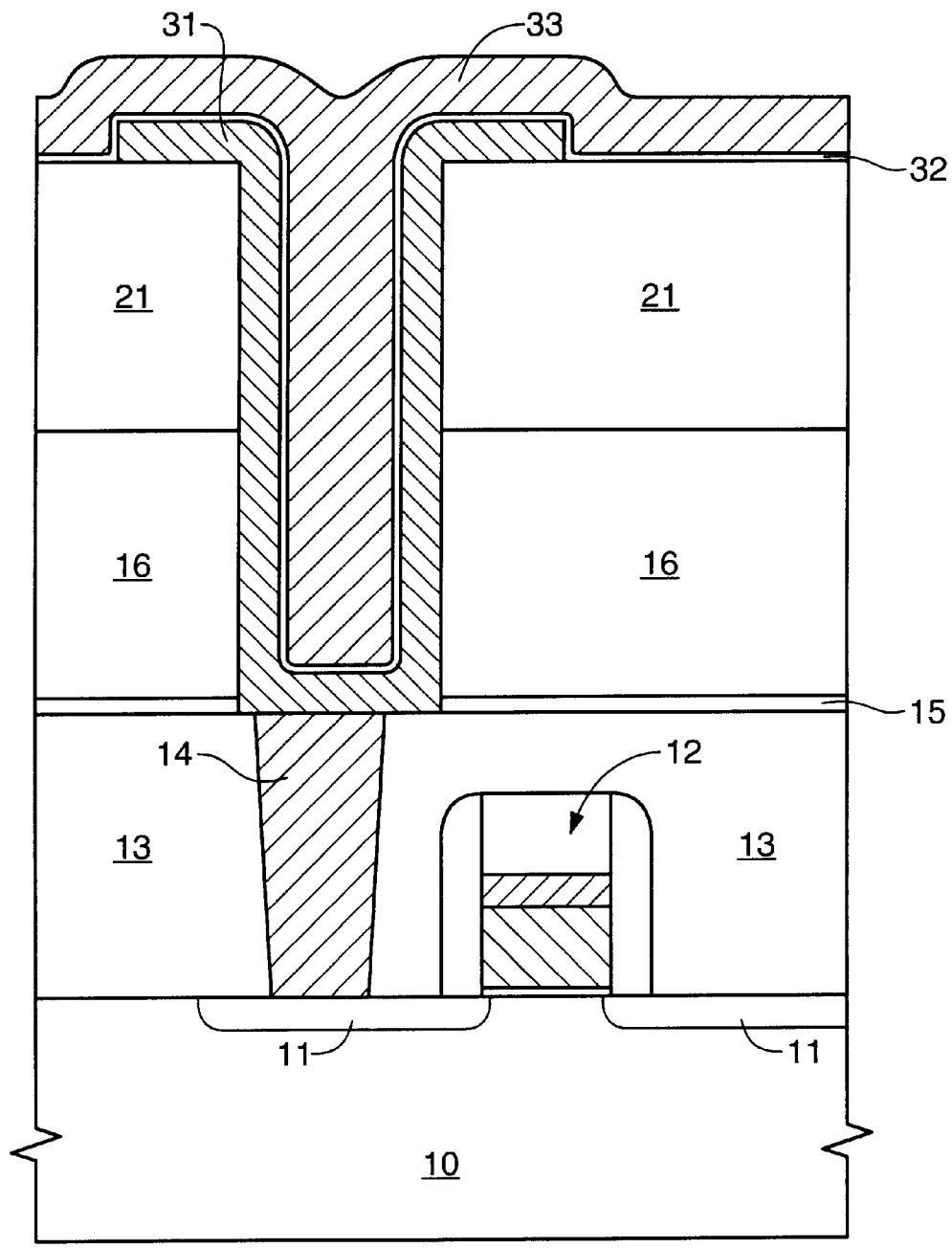
FIG. 3 is a subsequent cross-sectional view taken from FIG. 2 depicting the formation of a storage capacitor having a high aspect ratio storage electrode.
Figure 4:
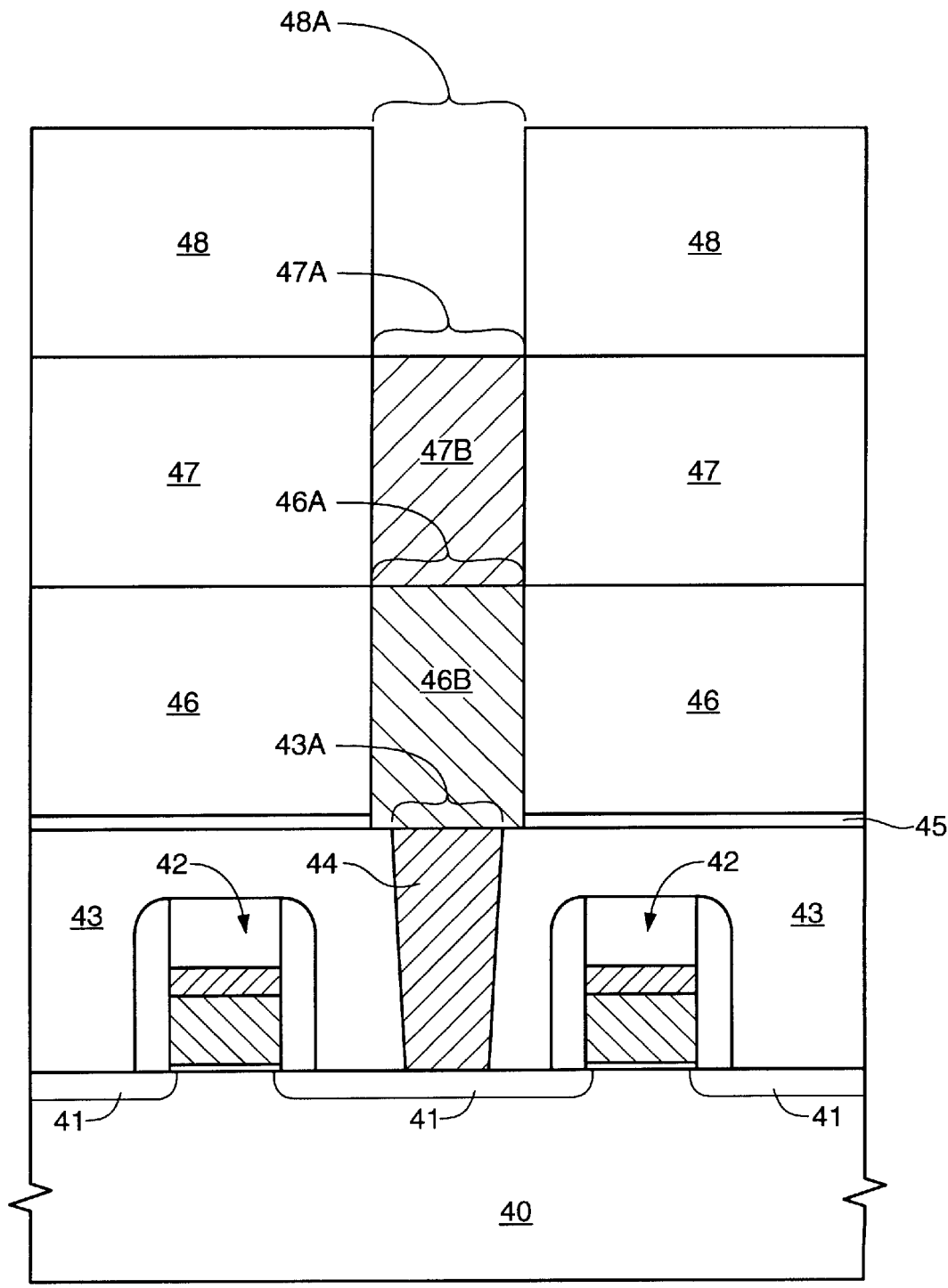
FIG. 4 is a cross-sectional view depicting multiple building levels on a semiconductor substrate used to form a high aspect ratio opening by process steps in accordance with the present invention.

Exemplary implementations of the present invention are directed to a process for forming a high aspect ratio structure in a semiconductor device, such as a storage capacitor, as depicted in the embodiment of FIGS. 1–3, or such as a conductive interconnect, as depicted in the embodiment of FIG. 4.

Referring to FIG. 1, a semiconductive substrate 10, such as a silicon wafer, is prepared for the processing steps of the present invention. Diffusion regions 11 are implanted into substrate 10 to form source/drain regions to an access transistor gate 12. Insulation material 13, such as borophospho-silicate glass (BPSG), isolates the underlying access transistor, formed by the source/drain regions and the access transistor gate, from subsequently formed conductive structures. A conductive plug 14, such as conductively doped polysilicon, is formed in an opening in insulation material 13 and makes contact to diffusion region 11. The resulting structure, comprising insulation material 13 and conductive plug 14, is then planarized.

Next a film 15, such as tetra-ethyl-ortho-silicate (TEOS), is formed on the planarized surface of insulation material 13 and conductive plug 14. Film 15 is not required, but preferred, as the presence of film 15 will provide an etch stop layer to prevent the potential removal of a portion of conductive plug 14 by a subsequent etch.

Next, insulation material 16, such as BPSG, is formed on film 15, if film 15 is present, or on the planarized surface of insulation material 13 and conductive plug 14, if film 15 is not present. An opening 17 is formed into insulation material 16 and is aligned so that opening 17 overlies a major portion of conductive plug 14. For processing technology presently being used in the industry, an exemplary aspect ratio of opening 17 could be approximately 4:1 or greater (aspect ratio = height (or length) to width ratio). Then opening 17 is filled with a sacrificial material 18, such as polysilicon, titanium nitride (TiN), or any material which can be etched with selectivity to BPSG (a selectivity to BPSG that is greater than 10:1 is preferred). The resulting structure of insulation material 16 and sacrificial material 18 is then dry etched or planarized (such as through chemical mechanical planarization) such that only the electrically isolated plugs in the BPSG remain. Insulation material 16, opening 17 and sacrificial material 18 make up a first building level. Sacrificial material 18 would not need to be included in the first building level if a subsequent level is not required.

Referring now to FIG. 2, insulation material 21, such as BPSG, is formed on the planarized surface of the structure comprising insulation material 16 and sacrificial material 18. An opening 22 is formed into insulation material 21 and is aligned so that the opening overlies a major portion of sacrificial material 18. Proper alignment is accomplished by using the same reticle to pattern the wafer for both opening 17 and opening 22. It is also possible to use different (but identical) reticles for the two levels. In either case the alignment of opening 22 to opening 17 will depend on the accuracy of the photolithography equipment used. It is desirable that photo alignment is sufficient to land opening 22 on sacrificial material 18, thus aligning opening 22 to opening 17. In this exemplary implementation of the present invention, the aspect ratio of second opening 22 would be 4:1 or greater, thus making the overall aspect ratio of the two combined openings to be 8:1 or greater. Insulation material 21 and opening 22 make up a second structure building level. A sacrificial material to fill opening 22 would be included in the second building level if a subsequent level is required to increase the overall aspect ratio of the openings.

Referring now to FIG. 3, sacrificial material 18 and film 15 (if present) are removed using a wet or dry etch. It is during this etch where the importance of film 15 becomes apparent. Film 15 will prevent the etch from removing some of conductive plug 14 and possibly causing damage to the wafer (substrate 10) itself The etching sequence, starting with the formation of opening 22 and finishing with the removal of sacrificial material 18 and film 15 (if present), can be accomplished by various methods.

A selective etch can be used if sacrificial material 18 is polysilicon and insulation material 21 is BPSG. With this scenario, an oxide etch is performed to create opening 22 in BPSG insulation material 21, with the etch stopping on polysilicon sacrificial material 18. Typically the oxide etch is performed with a fluorine containing gas mixture, such as carbon tetrafluoride ($CF_4$) or carbon triflouride ($CF_3$). The oxide etch is then followed by a selective polysilicon etch to remove polysilicon sacrificial material 18. Typical conditions for this polysilicon etch are 200 mTorr, 310Watts, 60sccm chloride ($Cl_2$), 30sccm hydrogen bromine (HBr). The selectivity for the polysilicon etch using these typical conditions is greater than 10:1 and therefore allows the removal of the sacrificial polysilicon material with essentially no further etching of the exposed BPSG at opening 22.

In another scenario, if the sacrificial material 18 is titanium nitride (TiN), the etch would consist of $CF_4$ which etches TiN with respect to BPSG with a preferred selectively ratio of TiN to BPSG that is greater than 10:1.

In either of the above scenarios, the etch sequence can be a one etch process with two etching steps, one to remove oxide and one to remove polysilicon, or two separate etch processes performed in different tools.

Once opening 17 is cleared of sacrificial material 18 and the underlying exposed portion of film 15 is removed (if present), a conformal conductive layer 31, such as conductively doped polysilicon, conductively doped hemi-spherical grain (HSG) silicon, or the like, is formed along the walls of openings 17 and 22 and makes contact to the exposed upper surface of conductive plug 14. Conformal conductive layer 31 is patterned and etched to serve as a high aspect ratio storage electrode.

A capacitor dielectric film 32 is formed over conformal conductive layer 31 and finally a second capacitor electrode is formed over dielectric film 32 from a conductive material 33, such as a metal. Processing then continues to complete the device as needed.

In this exemplary implementation the aspect ratio of the storage electrode would be 8:1 or greater, which directly relates to the combined aspect ratio of the openings created through each structure building level used. The desired height of a storage electrode can be obtained by using the corresponding number of structure building levels needed. Using the present example, a structure of 8:1 or 12:1, etc., can be effectively built. The present invention will provide a resulting structure having a substantially straight profile (i.e., the opposing walls of the resulting structure being substantially parallel), rather than a typical sloped profile resulting from conventional processing techniques. The substantially straight profile of the storage electrode will effectively increase capacitor performance due to greater surface area achieved.

Figure 5:
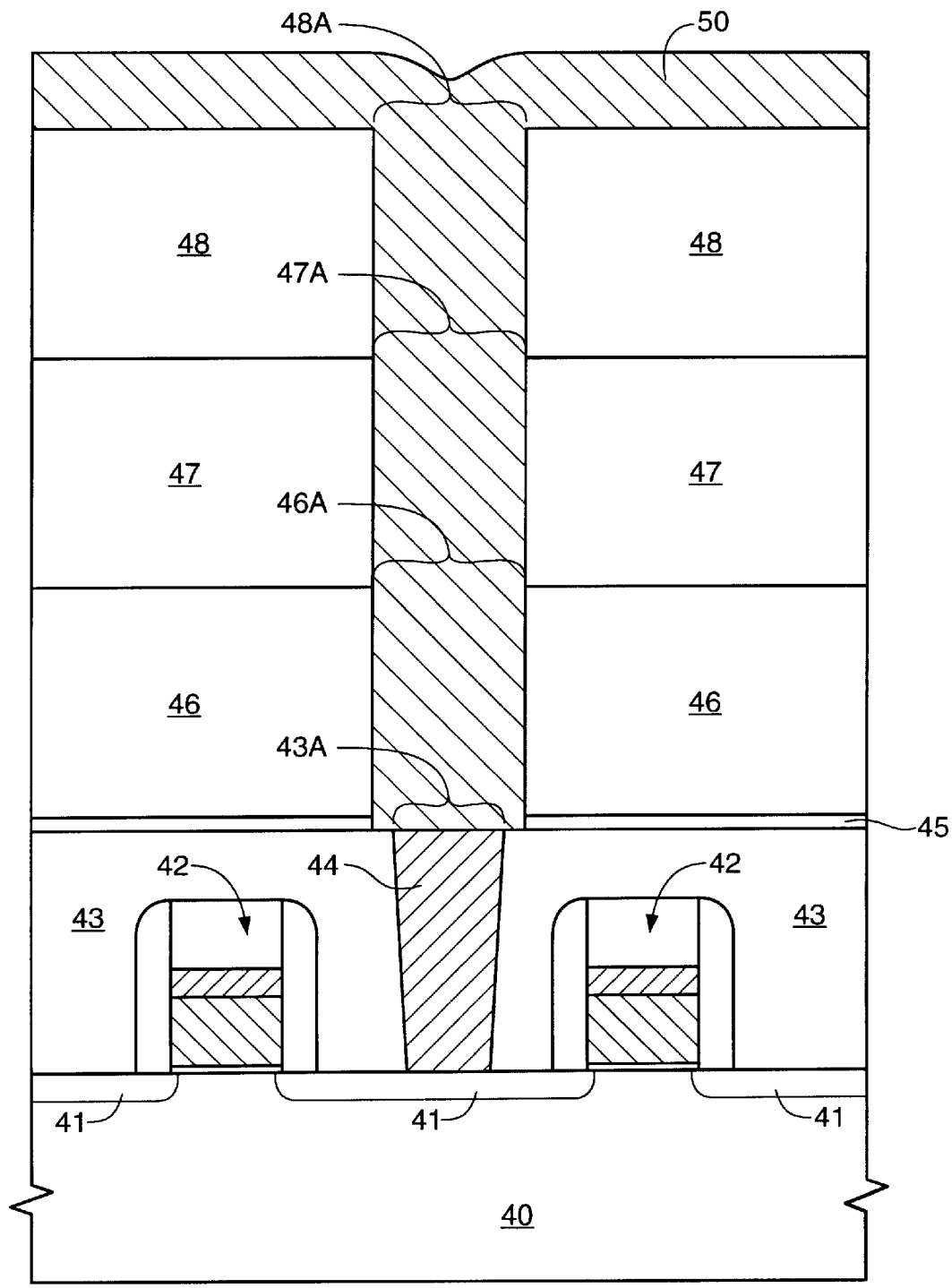
FIG. 5 is a cross-sectional view depicting a semiconductor substrate comprising a conductive interconnect having a high aspect ratio formed by the process steps in accordance with the present invention.

A second exemplary implementation of the present invention is depicted in FIGS. 4 and 5. Referring to FIG. 4, a semiconductive substrate 40, such as a silicon wafer, is prepared for the processing steps of the present invention. Diffusion regions 41 are implanted into substrate 40 to form source/drain regions to access transistor gates 42. Insulation material 43, such as boro-phospho-silicate glass (BPSG), isolates the underlying access transistor, formed by the source/drain regions and the access transistor gates, from subsequently formed conductive structures. A conductive plug 44, such as conductively doped polysilicon, is formed in opening 43a (in insulation material 43) and makes contact to diffusion region 41. The resulting structure comprising insulation material 43 and conductive plug 44 is then planarized.

Next, a film 45, such as tetra-ethyl-ortho-silicate (TEOS), is formed on the planarized surface of insulation material 43 and conductive plug 44. Film 45 is not required, but preferred, as the presence of film 45 will be advantageous. Film 45 will provide an etch stop layer and prevent the potential removal of a portion of conductive plug 44 by a subsequent etch performed later in the process.

Next a second insulation material 46, such as BPSG, is formed on film 45, if film 45 is present, or on the planarized surface of insulation material 43 and conductive plug 44, if film 45 is not present. An opening 46a is formed into insulation material 46 and is aligned so that the opening overlies a major portion of conductive plug 44. For processing technology presently being used in the industry, an exemplary aspect ratio of second opening 46a could be approximately 4:1. Then, opening 46a is filled with first sacrificial material 46b, such as polysilicon, titanium nitride (TiN), or any material which can be etched with selectivity to BPSG (a selectivity to BPSG that is 10:1 or greater is preferred). The resulting structure of second insulation material 46 and first sacrificial material 46b is then planarized. It is preferred that the BPSG be planarized before sacrificial material 46b is added, though it is not required.

Continuing with FIG. 4, third insulation material 47, such as BPSG, is formed on the planarized surface of the structure comprising second insulation material 46 and first sacrificial material 46b. Third insulation material 47 is then planarized. An opening 47a is formed into third insulation material 47 and is aligned so that opening 47a overlies a major portion of first sacrificial material 46b. As before, an exemplary aspect ratio of opening 47a could be approximately 4:1. Proper alignment is accomplished by using the same reticle to pattern the wafer for both opening 46a and opening 47a. It is also possible to use different (but identical) reticles for the two levels. In either case the alignment of opening 47a to first sacrificial material 46b will depend on the accuracy of the photolithography equipment used. It is desirable that photo alignment is sufficient to land opening 47a on first sacrificial material 46b. A second sacrificial material 47b is then formed into opening 47a and then planarized.

Continuing with FIG. 4, fourth insulation material 48, such as BPSG, is formed on the planarized surface of the structure comprising third insulation material 47 and second sacrificial material 47b. Fourth insulation material 48 is then planarized. An opening 48a is formed into fourth insulation material 48 and is aligned so that opening 48a overlies a major portion of second sacrificial material 47b. As before, an exemplary aspect ratio of opening 48a could be approximately 4:1. Proper alignment is accomplished as mentioned above.

Next, sacrificial materials 47b, 46b and film 45 (if present) are removed using a wet or dry etch. It is during this etch where the importance of film 45 becomes apparent. Film 45 will prevent the etch from removing some of conductive plug 44 and possibly causing damage to the wafer (substrate 40) itself. The etching sequence, starting with the formation of opening 48a and finishing with the removal of sacrificial materials 47b, 46b and film 45 (if present) can be accomplished by the methods described in the first exemplary implementation of the present invention.

Each building level comprising the steps of 1) forming a planarized layer of insulation material, 2) forming an opening therein that is aligned to the underlying sacrificial material and then, 3) forming a planarized sacrificial material into the opening, may be repeated or even deleted as desired in order to obtain as deep of an interconnect as needed for a given device (or create the desired interconnect with the desired high aspect ratio).

Referring now to FIG. 5, openings 47a and 46a are cleared of sacrificial materials 47b and 46b and the underlying exposed portion of film 45 (if present) is removed. Next, conductive material 50, a metal such as tungsten (W) or titanium nitride (TiN), is formed to fill openings 48a, 47a and 46a and to make contact to the exposed upper surface of conductive plug 44. Conformal conductive layer 50 is patterned and etched to serve as a high aspect ratio interconnect between diffusion 41 and an upper level conductive line, such as a bit line in a DRAM. In this example, the resulting interconnect will have a substantially straight profile (i.e., the opposing walls of the resulting structure being substantially parallel) and an overall aspect ratio of approximately 12:1. The process of the present invention will form an interconnect that not only has a substantially straight profile, but one with reduced resistance as compared to a typical interconnect with a sloped profile. Processing then continues to complete the device as needed.

Though an aspect ratio of 4:1 for each building level is used in each exemplary implementation of the present invention, the aspect ratio used for each level need not be limited. The final result of the present invention is a structure having a high aspect ratio where the height of the structure is greater than its width while maintaining a substantially straight profile. For purposes of the present invention obtaining a structure with a substantially straight profile is defined as structure having a consistent width from its top surface to its bottom surface or a structure having sidewalls that intersect an underlying surface at an angle that is 88° or greater. In that regard, multiple building levels using aspect ratios ranging from the height being less than the width to the height being greater than the width can be used. For example, one way to obtain a final structure having a high aspect ratio of 8:1 would be to use sixteen building levels, each having an aspect ratio of 0.5:1. Another way to form a structure having an aspect ratio of 8:1 would be to use four (4) building levels, each having an aspect ratio of 0.5:1, one building level having an aspect ratio of 2:1 and one building level having an aspect ratio of 4:1.

It is to be understood that although the present invention has been described with reference to several preferred embodiments, various modifications, known to those skilled in the art, may be made to the process steps presented herein without departing from the invention as recited in the several claims appended hereto.

What is claimed is:

1. A process for forming a conductive interconnect structure during semiconductor fabrication, said process comprising the steps of:

forming a plurality of layered insulation materials having openings therein, said openings aligning to one another and to an underlying conductive region;

after the formation of an opening in a given insulation material and prior to the formation of the next layered insulation material, filling said opening with a sacrificial material, excluding the top most opening;

removing said sacrificial material and exposing said underlying conductive region;

forming conductive material into said openings to make contact with said conductive region, said conductive material having an aspect ratio with the length being greater than the width.

2. The process as recited in claim 1, further comprising the step of forming an etch stop film directly on said underlying conductive region.

3. The process as recited in claim 1, further comprising the step of planarizing each layer of said plurality of insulation materials.

4. The process as recited in claim 1, further comprising the step of planarizing each sacrificial material prior to the formation of a subsequently formed layer of said plurality of insulation materials.

5. The process as recited in claim 1, wherein said step of removing comprises a selective etch that possesses an etching selectivity ratio of sacrificial material to insulation material that is greater than 10:1.

6. A process for forming a conductive interconnect structure during semiconductor fabrication, said process comprising the steps of:

forming a plurality of layered, boro-phospho-silicate glass (BPSG) material and forming openings therein, said openings aligning to one another and to an underlying contact region, each layer of said BPSG material being planarized prior to the formation of a subsequent layer of BPSG material;

after the formation of an opening in a given layer of BPSG material and prior to the formation of subsequent layer of BPSG material, filling said opening with a polysilicon material, excluding the top most opening;

removing said polysilicon material and exposing said underlying contact region without substantially enlarging said openings, said step of removing comprises an etching process that uses an etching selectivity ratio of polysilicon to BPSG that is greater than 10:1;

forming a conductive metal into said openings to make contact with said contact region, said conductive metal having an aspect ratio with the length being greater than the width.

7. The process as recited in claim 6, further comprising the step of forming a tetraethyl-ortho-silicate (TEOS) etch-stop film directly on said underlying contact region.

8. A process for forming a high aspect ratio capacitor during semiconductor fabrication, said process comprising the steps of:

forming a first insulation material over a conductive region;

forming a first opening in said first insulation, said first opening aligning to said conductive region;

forming a sacrificial material into said first opening;

forming a second insulation material directly on said first insulation material and said sacrificial material;

forming a second opening in said second insulation material to expose a major portion of said sacrificial material;

removing said sacrificial material to expose said underlying conductive region;

forming a conformal conductive layer into said first and second openings and making contact with said conductive region;

patterning said conformal conductive layer into a first capacitor plate, said first capacitor plate having an aspect ratio with the length being greater than the width;

forming a capacitor dielectric over said first capacitor plate;

forming a second capacitor plate over said capacitor dielectric.

9. The process as recited in claim 8, further comprising the step of forming an etch stop film directly on said conductive region prior to the formation of said first insulation material.

10. The process as recited in claim 8, further comprising the step of planarizing each layer of said insulation materials.

11. The process as recited in claim 8, further comprising the step of planarizng said sacrificial material prior to the formation of a said second insulation material.

12. The process as recited in claim 8, wherein said step of removing comprises a selective etch that possesses an etching selectivity ratio of sacrificial material to insulation material that is greater than 10:1.

13. A process for forming a high aspect ratio capacitor during semiconductor fabrication, said process comprising the steps of:

forming a first layer of planarized boro-phospho-silicate glass (BPSG) material over a conductive region;

forming a first opening in said first layer of planarized BPSG material, said first opening aligning to said conductive region;

forming a planarized polysilicon material into said first opening;

forming a second layer of planarized BPSG material directly on said first layer of planarized BPSG material and said planarized polysilicon material;

forming a second opening in said second layer of planarized BPSG material to expose a major portion of said planarized polysilicon material;

removing said planarized polysilicon material to expose said underlying conductive region, said step of removing said planarized polysilicon comprises an etch possessing an etching selectivity ratio of polysilicon material to BPSG material that is greater than 10:1;

forming a conformal conductive silicon layer into said first and second openings that makes contact with said conductive region;

patterning said conformal conductive silicon layer into a first capacitor plate;

forming a capacitor dielectric over said first capacitor plate, said first capacitor plate having an aspect ratio with the length being greater than the width;

forming a second capacitor plate over said capacitor dielectric.

14. The process as recited in claim 13, further comprising the step of forming a tetraethyl-ortho-silicate (TEOS) etch-stop film directly on said conductive region.

* * * * *